United States Patent [19]

Brant et al.

[11] Patent Number: 5,708,771
[45] Date of Patent: Jan. 13, 1998

[54] FAULT TOLERANT CONTROLLER SYSTEM AND METHOD

[75] Inventors: William Alexander Brant, Boulder; Michael Edward Nielson, Broomfield; Gary Ward Howard, Boulder, all of Colo.

[73] Assignee: EMC Corporation, Hopkinton, Mass.

[21] Appl. No.: 561,337

[22] Filed: Nov. 21, 1995

[51] Int. Cl.$^6$ .................................. G06F 12/16; G06F 1/30
[52] U.S. Cl. ........................... 395/182.2; 395/182.12; 395/182.04
[58] Field of Search ............... 395/182.2, 182.03, 395/182.04, 182.05, 182.07, 182.12, 182.18, 183.12, 750

[56] References Cited

U.S. PATENT DOCUMENTS

| | | | |
|---|---|---|---|
| 4,527,271 | 7/1985 | Hallee et al. | 395/182.07 X |
| 4,607,330 | 8/1986 | McMurray et al. | 395/182.12 |
| 4,672,529 | 6/1987 | Kupersmit | 364/130 |
| 5,140,592 | 8/1992 | Idleman et al. | 395/182.03 |
| 5,148,432 | 9/1992 | Gorden et al. | 395/182.05 |
| 5,155,845 | 10/1992 | Beal et al. | 395/182.04 |
| 5,185,693 | 2/1993 | Loftis et al. | 364/187 |
| 5,197,148 | 3/1993 | Blount et al. | 395/182.03 |
| 5,204,963 | 4/1993 | Noya et al. | 395/750 |
| 5,208,813 | 5/1993 | Stallmo | 395/182.05 |
| 5,235,601 | 8/1993 | Stallmo | 371/40.1 |
| 5,235,700 | 8/1993 | Alaiwan et al. | 395/182.11 |
| 5,239,646 | 8/1993 | Kimura | 395/185.07 |
| 5,274,645 | 12/1993 | Idleman et al. | 395/182.04 |
| 5,274,799 | 12/1993 | Brant et al. | 395/182.04 |
| 5,283,879 | 2/1994 | Carteau et al. | 395/425 |
| 5,289,589 | 2/1994 | Bingham et al. | 395/308 |
| 5,325,363 | 6/1994 | Lui | 371/8.1 |
| 5,379,417 | 1/1995 | Lui et al. | 395/182.05 |
| 5,390,187 | 2/1995 | Stallmo | 395/182.05 |
| 5,398,253 | 3/1995 | Gordon | 371/40.4 |
| 5,438,549 | 8/1995 | Levy | 365/229 |
| 5,469,566 | 11/1995 | Hohenstein et al. | 395/182.04 |
| 5,499,377 | 3/1996 | Gordon | 395/200.01 |
| 5,504,882 | 4/1996 | Chai et al. | 395/182.03 |
| 5,524,203 | 6/1996 | Abe | 395/182.04 |
| 5,548,711 | 8/1996 | Brant et al. | 395/182.03 |
| B1 4,965,717 | 10/1990 | Cutts, Jr. et al. | 395/182.1 |

*Primary Examiner*—Ly Hua
*Attorney, Agent, or Firm*—Holland & Hart LLP

[57] ABSTRACT

Data is recovered despite a single point of failure in a data exchanging system while accommodating scaleable data transfer rate performance. In the environment of at least two disk array controllers, a serial dumping scheme assists in recovery of data from a fast memory. It is imperative to avoid loss of write data from a host computer which is received and acknowledged but not yet stored in a disk medium. The configuration ensures that at least one of the controllers will handle the data so as to correct single failure point errors and properly store that data on one of the disks of an array. A fast memory providing a buffer between a remote host computer and arrays of data storage media is managed so that data received for writing is duplicated for reliability of storage while data for reading to the host computer is manipulated with an enhanced bandwidth of fast memory operation.

14 Claims, 4 Drawing Sheets

FAULT TOLERANT CONTROLLER SYSTEM AND METHOD

CROSS-REFERENCE TO RELATED APPLICATIONS

Commonly-assigned U.S. patent applications Ser. No. 08/363,132 entitled "A Fault Tolerant Memory System" by G. Neban, W. A. Brant and M. E. Nielson and Ser. No. 08/363,655 entitled "Method and Apparatus for Fault Tolerant Fast Writes Through Buffer Dumping" by W. A. Brant, G. Neben, M. E. Nielson and D. C. Stallmo (a continuation-in-part application of U.S. Ser. No. 08/112,791 by Brant and Stallmo which is itself a continuation-in-part of application Ser. No. 638,167 filed Jan. 6, 1991 by Brant, Stallmo, Walker and Lui the latter of which is now U.S. Pat. No. 5,274,799) describe fault tolerant data processing apparatus and processes related to this application.

BACKGROUND OF THE INVENTION

1. Field of the Invention

The present invention relates to fault tolerant data processing structures and procedures. More particularly, the present invention relates to digital data handling structures and methods which can dynamically overcome errors resulting from various sources during transmission of digital data between computer oriented complexes. While not necessarily so limited, the present invention is especially useful in enhancing the reliability of digital data transmissions between host computers and caching disk array controller systems.

2. Description of the Related Art

Caching controllers that interface with host computers or the like for directing data exchanges with large arrays of magnetic data storing disks, or other storage media have developed for providing a storage medium for large quantities of digital information. These controllers respond to read and write commands from a remote computer system to receive, and/or deliver data over interconnecting busses.

Preferably, the caching controller should function so that it minimizes demands on the host system, while including the ability to recover wherever possible from errors from single points of failure. A single point of failure can occur from loss of a component or element in the transmission chain, spurious interfering signals, or any of a variety of sources. System configurations and operations capable of dynamically overcoming single points of failure are sometimes referred to as fault tolerant systems.

Redundant storage devices and controlling subsystems have provided fault tolerant operations for data transmission and storage purposes. Such controllers can provide a "fast write" function wherein data intended for writing onto a disk medium is received in a manner that allows the receiving system to confidently acknowledge to the transmitting host that the data was properly received even before the received data is actually recorded in a magnetic disk.

The received data is redundantly stored in a high speed temporary memory where it is checked for accuracy, and corrected for errors reflecting single point failures. Dual recording and comparison steps, along with various other known techniques, such as use of parity checks and applications of error detecting and correcting codes, are employed for this purpose. The aforementioned related patent applications describe such redundant fault tolerant systems and operations in a disk array controller environment.

Thus, fault tolerant caching disk array controllers are subject to several stringent requirements. First, no single component failure should cause loss of data or corruption of the data transferred. This mandates a certain redundancy and ability to "fail over" so as to transfer the function and/or data to independent redundant components.

Further, the controller must not require the host computer or central processor to wait for completion of a read or write operation to a disk. This means the controller must buffer write date into a protected fast memory, and must service most read data from fast memory. This requires the controller to have the ability to accept or provide data to the host computer at the data rate of the host computer connection, rather than at the rate the disk drives transfer data.

Finally, the user should have the capability of configuring cache performance by cost or other system constraints by adding, or removing, fast memory on the controller. This is predominantly a matter of resource allocation, as well as configuring the controller to match the performance and cost requirements of the system user.

SUMMARY OF THE INVENTION

The present invention is concerned with controllers that execute data exchanges between requesting host computers and one or more satellite data storage units associated with that controller. The invention is described herein with respect to a caching disk array controller in a fault tolerant disk array subsystem. Power supplies often employ components, such as tantalum capacitors at their outputs for noise filtering, but those capacitors sometimes fail so as to place a short across the power bus. Power system failure is a potentially catastrophic fault that requires tolerance in such systems. One feature of the present invention is the inclusion of redundant power systems in a shared configuration to enhance the ability of a data storage controller to recover from both a single point of failure, as well as to provide the ability to recover from a major system power loss.

The aforementioned feature is particularly useful in systems which employ at least two such disk array controllers. In the multiple controller environment, the implementation of controller interconnections, such as the redundant serial dumping busses described in the related applications mentioned previously herein, materially assists in fault tolerance with minimal impact on the remote host device.

A controller in which one feature of the present invention is useful has a plurality of elements arranged to receive data exchange controlling commands from a remote computer. These commands are utilized in conjunction with a fast memory to buffer data accompanying such commands between the computer and at least one satellite data storage unit, such as an array of disk drives. The memory controller includes a subset of elements whose primary purpose is for retrieving data from the fast memory for transfer to an output terminal. A first power source is coupled for introducing energizing power to all elements of this controller, whereas a second power source is coupled for concurrently energizing the aforementioned subset of elements. The system responds to loss of energizing power from the first power source for causing the subset of elements to transfer data contained in the fast memory to an output terminal.

The subset of elements can typically include a Dynamic Random Access Memory (DRAM), and a memory controller attached to it. A diode coupler network can connect the pair of power sources to this DRAM and to the memory controller. The element subset can also include a frequency stable oscillator for generating a stream of clock pulses for enabling the functions of the memory controller with the diode coupler further including connections for energizing this oscillator.

The pair of power sources can each include a main power output cable actuated with adequate power for energizing all elements of the memory controller, and an auxiliary power output actuated with adequate power for energizing just the subset of elements. Concurrent power is thus supplied through the diode coupler through connections to the first power source main power output cable, and to the second power source auxiliary controller.

Such a system can further include redundant storage media array controllers for responding to requests from a host computer for transferring data between that host computer and an array of data storing media. In this arrangement, first and second array controllers each are provided with at least one buffer memory, a memory controller, a host interface device, and at least one data storing media interfacing device. The array controllers can further include main and shadow controllers and data buffer memories for full fault tolerant operation, if desired.

A pair of power supplies are employed, each having a main output connection providing adequate power for energizing all elements of a given array controller, and an auxiliary output connection providing adequate power for energizing a subset of those elements. This subset can include a buffer memory, and a memory controller. In the redundant array controller system, the main output connections are coupled to all the elements of a respective one of the redundant array controllers. The auxiliary output connections are likewise coupled to the subset of elements of a respective one of the array controllers.

Fault tolerant systems have often included an arrangement for supporting data communication between the memory controllers of the array controllers. A failure of either of the primary power supplies causes the memory controller of the array controller, energized by that failed main output array connection, to transfer data contained in its buffer memory connection, into the buffer memory of the array controller energized by the main power output of the other of the power sources. The subset of elements of each array controller can include an oscillator for producing a stream of actuating clock pulses for the memory controller associated therewith.

It is important that the failure responsive operation occur when the power supply has failed at a time that the host computer has delivered data for writing into a storage media. Still further, the system can notify the host computer that said power supply failure has occurred. This allows the host to arrange for appropriate corrective action, even though the fault tolerant system continues to function in the meantime.

A method in accordance with this invention utilizes a buffer memory which functions under the direction of an attached controller for transferring data into, and out of, satellite data storage units, such as disk drive arrays. This is done in response to data write and read requests originating from a remote host computer. The write requests are monitored from the host computer for determining an anticipated quantity of storage needed for temporarily retaining data in the buffer memory before it is transferred to the satellite data storage units.

Boundaries are established within the fast buffer memory based upon the quantity of storage needed for accommodating the outstanding write data requests as monitored from the host computer. The memory controller is allowed to place only write data in the buffer memory on one side of this boundary, and only read data recordation on the other side thereof. The data associated with write requests from the host computer is inserted in duplicate locations within the portion of the buffer memory dedicated for write data recordation. As a result, data is concurrently handled in mirrored fashion within the portion of the buffer memory dedicated to host computer write requests, and in a higher bandwidth, non-mirrored fashion in the portion of the buffer memory dedicated to host computer read requests.

It is thus possible to compare write data stored in the aforementioned duplicate locations to indicate transfer of such write data to the satellite storage medium is proper in the presence of a favorable such comparison. It is possible to use contemporary error recovery information for correcting any errors associated with write data placed in the buffer memory. By detecting that the memory controller cannot complete storage of write data in the satellite storage medium, the fault tolerant operation transfers the write data from the buffer memory to another array controller for storage in its buffer memory.

The initial memory cycle of a DRAM-type memory typically requires longer than later cycles. Thus, to speed up the overall response time of the buffer memory, initiation of a memory cycle for all units of the buffer memory concurrently at the start of each memory recordation sequence can also improve system response time. Addressing specific memory locations thereafter enables appropriate data storage, thereby reducing the total time required to record a given set of data in the buffer memory.

The process of the present invention is advantageously useful in environments wherein there are a plurality of sets of satellite data storage devices, each associated with its own array controller. Such an array controller might employ a pair of buffer memories, each of which functions under the direction of a respective one of a pair of memory controllers within the array controller for transferring data into and out of sets of satellite data storage units attached thereto. These functions are performed in response to data write and read requests originating from a remote host computer. In this environment, it is possible to establish the mirror/non-mirror boundary with respect to both buffer memories treated as a whole so as to define identical write and read portions.

This allows duplicate recording of write data as a main memory and a shadow memory, but in identical locations of the pair of memories. The read data is thus storable in the first available location of one of the locations in either one of the memory buffer read portions.

Those having normal skill in the art will recognize the foregoing and other objects, features, advantages and applications of the present invention from the following more detailed description of the preferred embodiments as illustrated in the accompanying drawings.

DETAILED DESCRIPTION OF THE PREFERRED EMBODIMENTS

The preferred embodiments of the present invention are herein described in the environment of a data processing system, including at least one host computer in a relatively remote location relative to a pair of disk subsystems each responsive to a separate cached disk array controller. Fully redundant data paths interconnect the host with the controllers, as well as between the controllers, such as by redundant serial dumping links. There are independent paths to write data to the memory in a mirrored fashion so that data is protected against loss.

Figure 1:
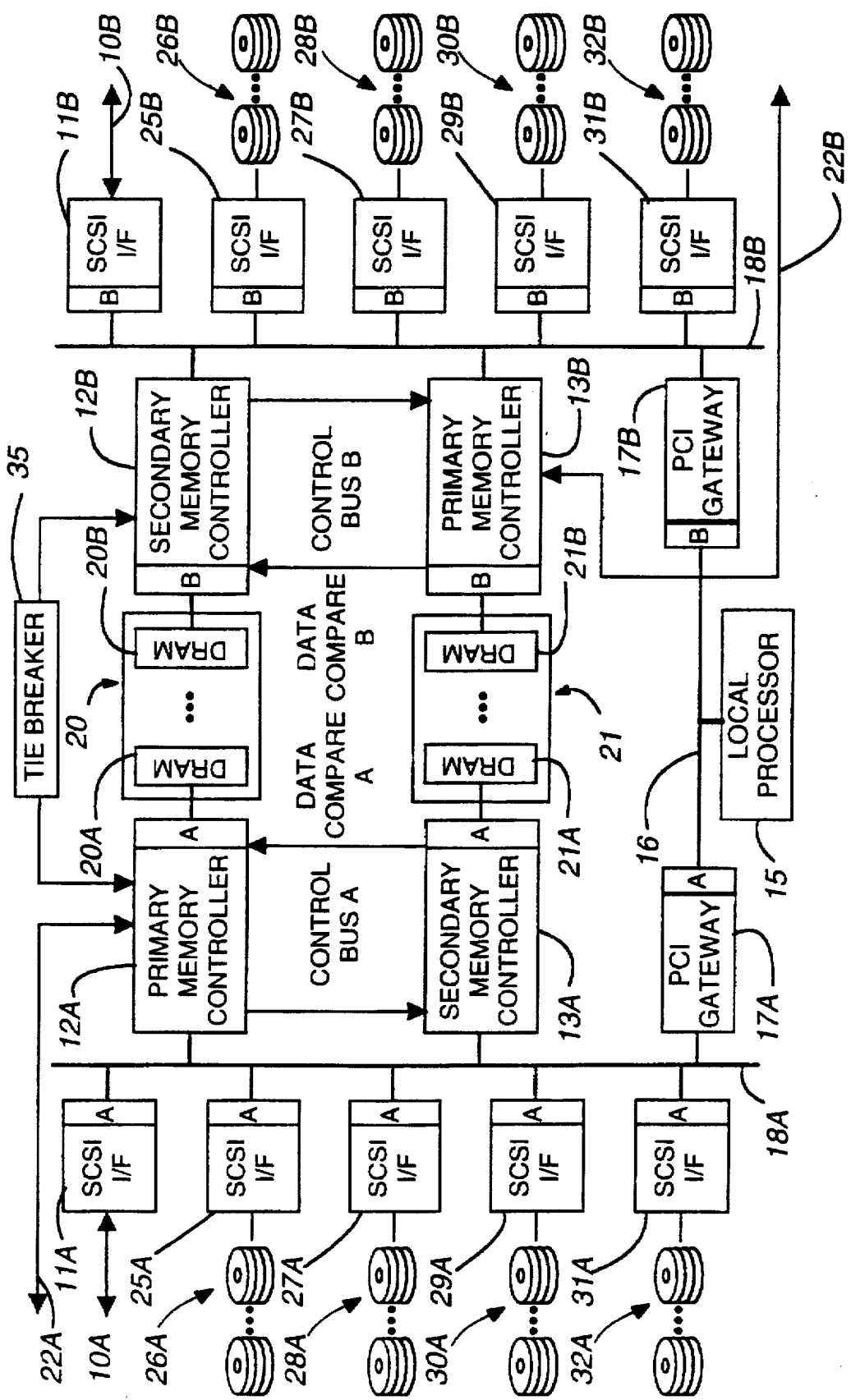
FIG. 1 is a system block diagram of a type of fault tolerant disk array controller useful in conjunction with the present invention.

One such fault tolerant disk array controller useful in conjunction with the present invention is shown in a system block diagram form in FIG. 1. Host computers (not shown) communicate with the FIG. 1 controller via busses 10A and 10B. Input busses 10A and 10B are well suited for implementation or cooperation with fiber optic connections, and are illustrated as Small Computer System Interface (SCSI) type connections into host interface devices 11A and 11B. Both commands and data to and from the host computers are handled via connections 10A and 10B, all of which can occur concurrently. Through PCI busses 18A and 18B, as well as PCI gateways 17A and 17B, local processor 15 strips host originated command signals from the interfaces 11A and 11B to direct the operation of the memory controllers 12 and 13 in handling the data associated with those commands.

Primary memory controller 12A and secondary controller 12B interact with fast memory 20, while secondary controller 13A and primary controller 13B interact with fast memory 21. The size of the fast memories 20 and 21 are selectable by the user, such as through use of Dynamic Random Access Memory (DRAM) modules. In the example shown in FIG. 1, memory 20 is configured by the user to incorporate two DRAM modules 20A and 20B, while another pair of DRAM modules 21A and 21B are employed for memory 21. Of course, either memory can function with a greater number of modules or with a single DRAM module.

Memories 20 and 21 essentially perform as buffers between the disk interfaces (25A and 25B, for example) with their associated disk storage units (i.e., 26A and 26B) for data received from, or intended for, the remote host. Since controllers 12A and 12B are both sharing fast memory 20, tie breaker circuit 35 ensures that neither will interfere with the other should both controllers attempt memory access at the same time. Primary memory controllers 12A and 13B, as well as secondary memory controllers 13A and 12B, are typically Application Specific Integrated Circuits (ASIC). The A and B sides use a pair of such ASIC's to accommodate the segregation of the power system for fault tolerance as is described in greater detail below.

Figure 2:
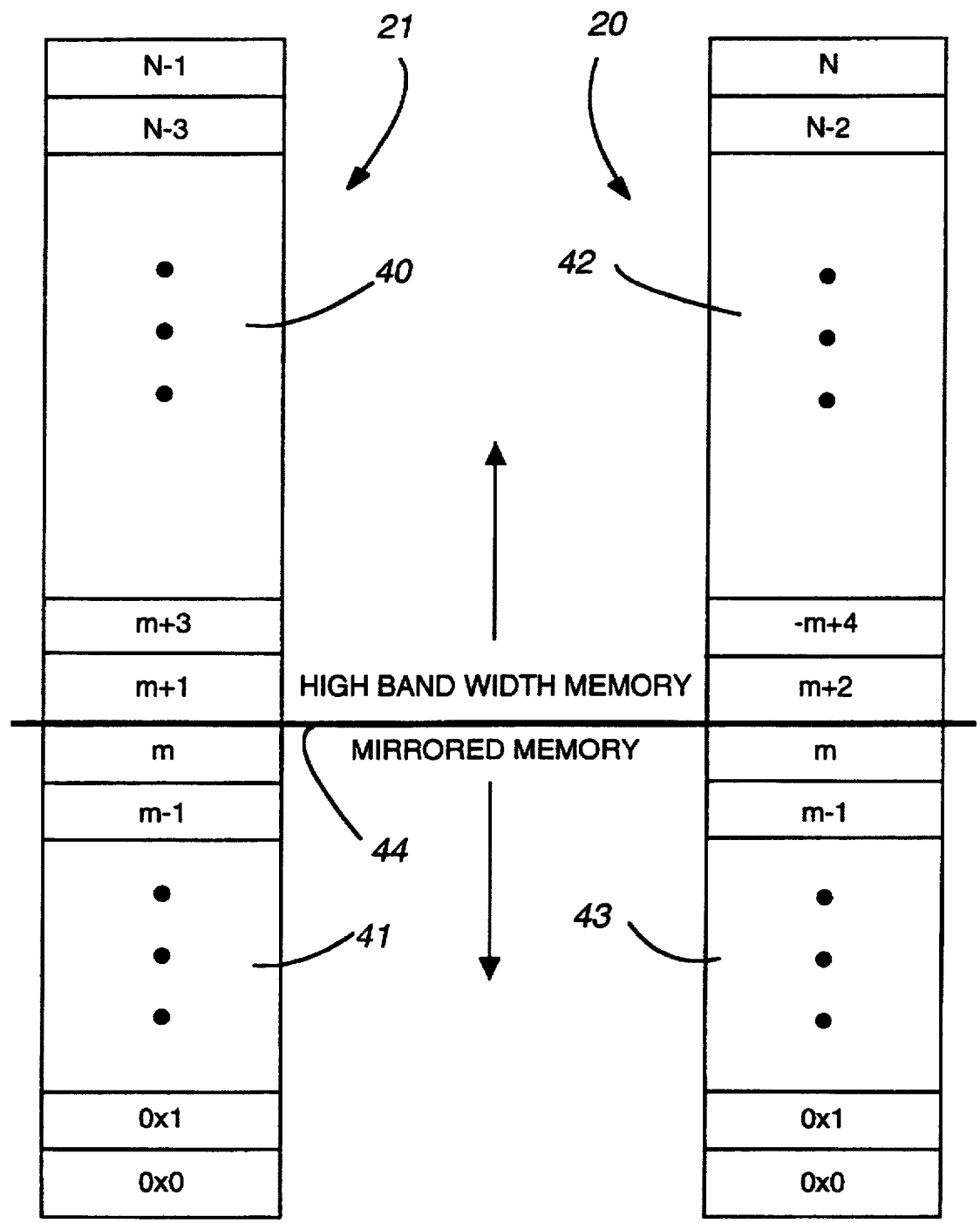
FIG. 2 shows the dynamic utilization of the fast mirrored memory in the FIG. 1 environment to assist fault tolerant operation.

The memory uses the DRAM most efficiently when there is differentiation between types of data stored. That is, controllers 12A and 13A can both access the memory 20 or 21 attached thereto independently as in response to read requests from the remote host while controller 13A and a portion of memory 21 are functioning as a shadow memory of the write data stored in memory 20 via controller 12A. This duality of use of the memories and controllers is generally illustrated in FIG. 2 wherein boundary 44 is the demarcation between mirrored and non-mirrored operation of memories 20 and 21. Controller 13A and memory 21 provide the data mirror function to assist in enhancing system reliability.

Loss of data intended for writing into the disk drives is intolerable as it does not exist in a protected format on the disk drives, unlike data that is read from the disk drives for transfer to the host. The write data is thus written in mirrored fashion to both the data memory 20 through a controller 12A or 12B, and the shadow memory 21 through controller 13A or 13B.

Data cached into the memories in response to read commands from the host does exist in protected form on the disk drives 26, 28, 30 and 32, and is held in memory for fast read access for the host. Therefore, loss of this data from memories 20 and 21 is tolerable should a component fail, but corruption of that data is not tolerable. By setting registers in memory controllers 12 and 13, some part of the memory is operated in a mirrored fashion to hold host write data so that each byte stored is stored in two memories, and thus requires two bytes of memory. The remaining memory stores one byte of data using one byte of the memory and a parity bit scheme sufficient to detect corrupted data as might result from an undetected component failure.

Accordingly, the system advantageously employs fault tolerant topography to boost performance. FIG. 2 presents a depiction of the memory configuration wherein the non-mirrored portion 40 of shadow memory 21 and 41 for memory 20 functions at twice the bandwidth of the mirrored portions 41 and 43. Memory portions 41 and 43 are dynamically configured to operate in a mirrored fashion. The remaining portions 40 and 42 of the memory stores data successively in the two memories so that the read and write bandwidth is doubled by operating both simultaneously.

Fault tolerance requires holding write data from the host in redundant memories. This necessitates redundant data paths as well. The present invention advantageously utilizes the redundant data path when transferring non-mirrored data by operating both data paths with successively stored data.

In a caching controller, such as that depicted in FIG. 1, the capacity of the memory and ease of upgrading are important. By providing many sockets in memories 20 and 21 to hold multiple memory modules along the lines of DRAMS 20A, 20B, 21A and 21B, the user can configure the controller to have a memory capacity appropriate to desired cost and performance criteria. FIG. 1 type memory controllers make use of the additional memory modules by operating them in interleaved mode, in addition to the usual page mode that DRAM devices use.

The use of multiple memory modules further increases memory bandwidth. This procedure eases the signal timing constraints required to operate the DRAM in a high bandwidth system. That is, it is preferable to employ many memory modules within as close a proximity to each other as possible as the use of modules which are separated by some distance tends to degrade high speed signals as a function of distance.

The first cycle for some memories requires considerably more time to execute than subsequent cycles. A technique for improving system operating speed is to cause all memory modules to perform the first cycle simultaneously by multiplexing the same address to all of them. Thereafter, selection of the individual addresses can effect data transfer with the least amount of lag time from module accessing. This improves the effective bandwidth of the system.

Figure 3:
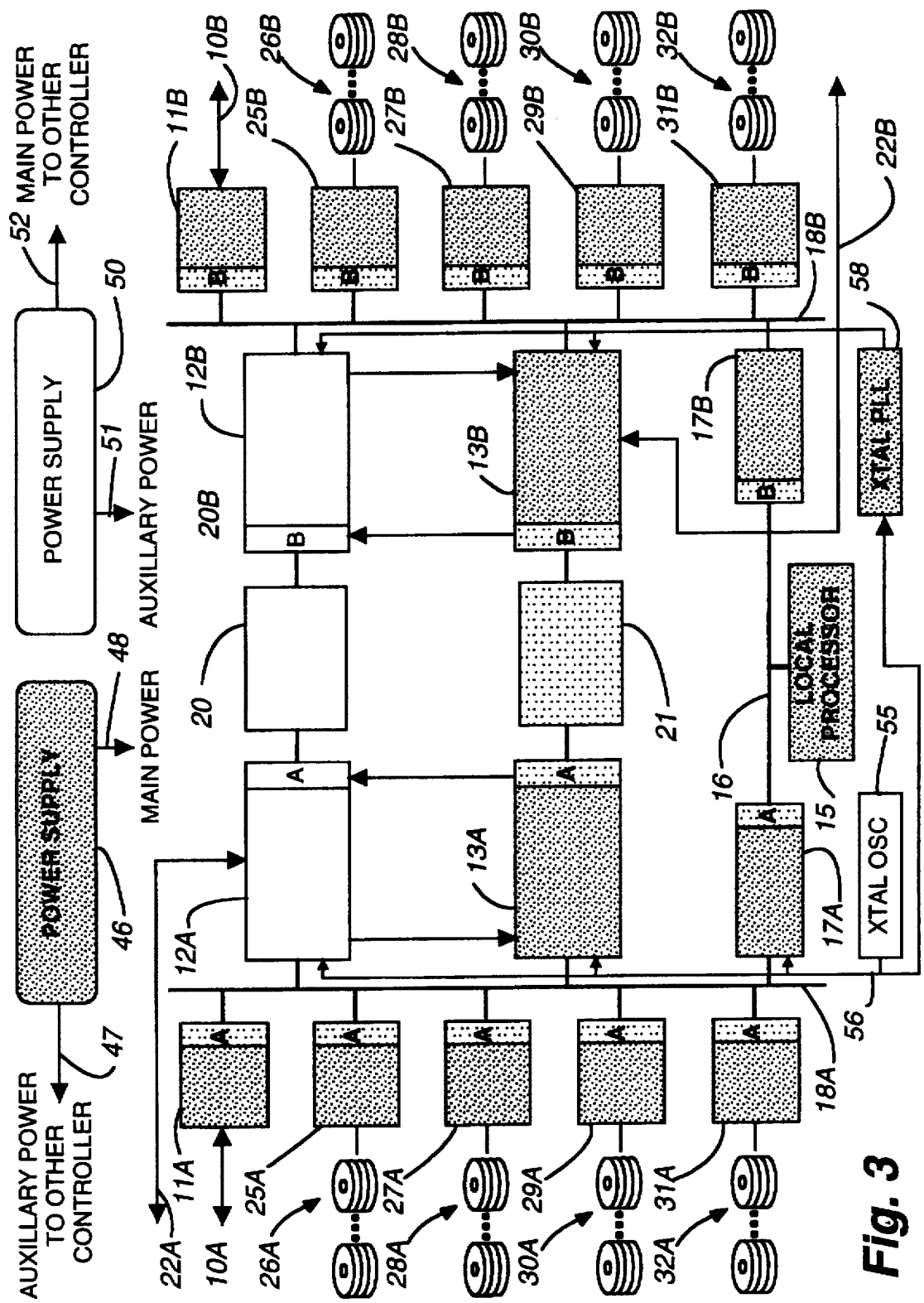
FIG. 3 is a system block diagram of a disk array controller illustrating its relationship to the redundant power system arrangement in accordance with the present invention.
Figure 4:
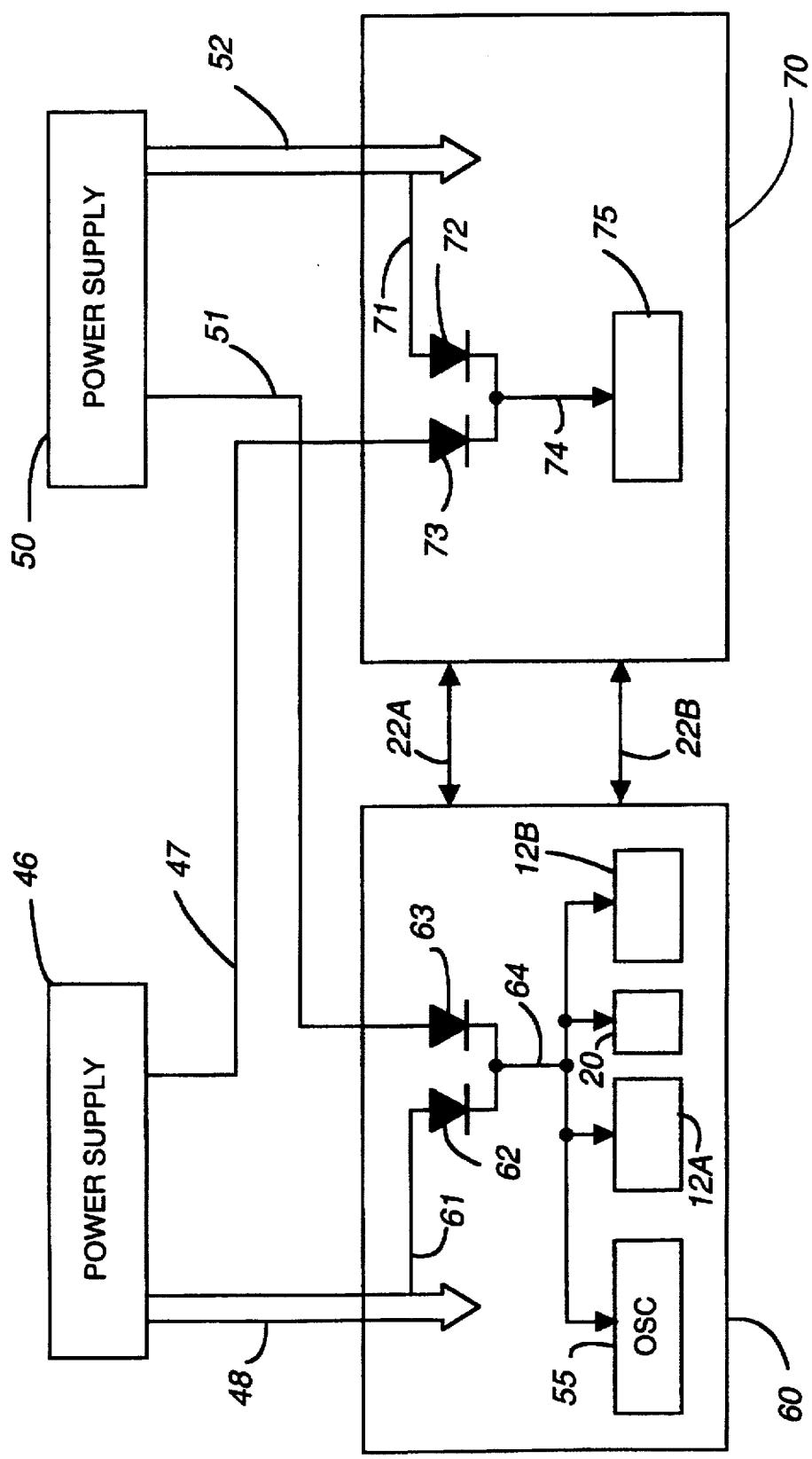
FIG. 4 is somewhat simplified block diagram showing the interrelationships of two cached disk array controllers employing the power distribution in accordance with FIG. 3.

A somewhat simplified block diagram of a power distribution arrangement in accordance with this invention is shown in FIG. 4. In this example, cached disk array controllers 60 and 70 are energized by power supplies 46 and 50. The relationship between these power supplies and the elements of one of those controllers 60 is presented in FIG. 3. That is, FIG. 3 is a system block diagram of disk array controller 60 illustrating its relationship to the redundant power system arrangement in accordance with the present invention.

Briefly, the power supplied to the controllers 60 and 70 is segregated such that a failure of either power supply 46 or 50 will not cause data loss in both of the memories of either controller. This is important where those memories are used in a mirrored configuration to hold write data received from the host. If either power supply 46 or 50 fails so that primary power is lost to one of controllers 60 or 70, the other controller employs the serial dump link 22A to recover the host write data contained in the fast memory associated with the first controller which data is then written to one or more disks.

As seen in FIGS. 3 and 4, power supply 46 provides main power over power bus 48 which is connected for energizing all of the components of controller 60. Connection 61 from main power bus 48 likewise provides power via a coupler formed from diodes 62 and 63 into power bus 64, and hence into a subset of certain selected key elements of controller 60. As shown, these elements include crystal oscillator 55, memory controllers 12A and 12B, and DRAM 20. This power distribution is illustrated in FIG. 3 wherein the stippled, or gray shaded components, are powered by main power bus 48 alone, while the clear elements are powered by both bus 48, as well as by the auxiliary power source 51 from power supply 50.

Auxiliary power output 47 of power supply 46 is similarly connected to the other controller 70 where it is OR coupled via diodes 72 and 73 into secondary power bus 74 to drive a subset 75 of components which correspond to the components driven by secondary power bus 64 in controller 60. Main power bus 52 of power supply 50 is coupled to energize all components of controller 70 including connection 71 which is diode OR coupled so as to enable components 75.

In operation, a host write present on input 10A involves interface controller 11A, PCI bus 18A, memory controllers 12A and 13A, memories 20 and 21, interfacing gateway circuit 17A, local processor 15, and crystal oscillator 55. The remote host transfers the write command through host interface 11A into local processor 15 where the command is interpreted. As a result, local processor 15 causes transfer of the host data through the host interface 11A into the DRAM address space that is mirrored. That is, the data is stored into one or more of the DRAMs 20A and 20B of memory 20 connected to controller 12A, as well as into one or more of the DRAMs 21A and 21B of memory 21 connected to controller 13A.

The data thus stored is now secure from degradation from a single point of failure. A "fast write" operation is then completed by generating an acknowledgement signal in response to the host command indicating to the host that the write is complete despite the fact that the data is not yet in any of the disk storage units. The local processor 15 completes the write to disk by transferring the thus temporarily stored data from memory unit 20 into one or more of the disk SCSI interfacing devices 25A–31A for storage in a disk medium.

The components involved in a transfer of mirrored write data to a B disk involves local processor 15, fast memories 20 and 21, controllers 12B and 13B, local processor bus 16, PCI gateway 17B, PCI bus 18B, one or more of SCSI interfaces 25B, 27B, 29B and 31B, and one or more of the associated disk drives 26B, 28B, 30B, and 32B. Local processor 15 sets up a transfer of data from memory to a disk through a SCSI interface circuit. Data is read from the mirrored portion of the memory address space so both the secondary memory controller 12B and the primary memory controller 13B read the respective portions 42 and 43 of DRAM memories 20 and 21 attached thereto.

The write data read by the secondary memory controller 12B is placed on the data compare B bus, and the primary memory controller 13B compares this data with the data read from the DRAM memory 21 attached to it. If the compare is successful, the data is transferred across the PCI bus 18B, and thence to a disk drive via elements 25B–32B. Failure to compare is followed by a check of the stored parity information. Data with good parity is placed upon the PCI bus 18B. All comparison failures are signaled to the local processor 15.

As shown in FIG. 2, the boundary 44 between mirrored data and the high bandwidth use of memory is dynamically shiftable under control of the local processor 15. Write data is entered in duplicate into respective portions 41 and 43 of the main memory 20 and shadow memory 21 in parallel. Since the system can concurrently accommodate several write data requests, as well as several requests to read data from the disk drives, the local processor inspects the magnitude of the write data input, and can dynamically shift boundary 44 accordingly.

The requests to read data do not require mirrored operation. Thus, they are alternately handled by memory 20 and 21 beginning with location N followed by location N-1 and so forth. The local processor normally will allocate the maximum amount of fast memory for the higher bandwidth functions, but must ensure that the boundary 44 is appropriately positioned to accommodate all the received data associated with write requests. As mentioned, it is not possible to recover from loss of write data within the disk array controller environment, but it is possible to retrieve data from the disk drives as it resides therein in protected form even after transfer to the fast memory in response to a host read request.

A host request to read data is similar to a write request, except data is transferred to the host, and the memory is used in its high bandwidth configuration. Read data is stored in the non-mirrored portion of address space, such as areas 40 and 42 in FIG. 2. A read to the host interface 11A causes the primary memory controller 12A and the secondary memory controller 13A to read the memories 20 and 21 respectively. As it is possible to have multiple memory modules connected to each memory controller, they are simultaneously accessible, and the data read in an interleaved fashion to further increase the read rate.

The data read by secondary memory controller 13A is passed to the primary memory controller 12A. Controller 12A interleaves the data from secondary memory controller 13A as it transfers the data across the PCI bus 18A to host interface 11A. As the interleaved data read from the memory may result in a higher data transfer rate than is associated with the PCI bus 18A, the primary and secondary controllers may buffer the read so the memory is useable by the controllers 12B and 13B.

During read, parity appropriate to the memory word size is checked to assure that the data is not corrupted. If so, the transaction is aborted, and the local processor 15 is notified to take corrective action. The data is still accessible by the host through the subsystem redundant controller on the disk drives.

Busses 10A and 10B can both communicate with different ports of the same host, or can have different (or redundant) hosts connected thereto. This makes it possible to access data in memories 20 and 21, even if cables to one or the other of inputs 10A or 10B are lost. All of the interfaces can simultaneously operate on different tasks in bursts.

Failure of a power supply 46 or 50, as by shorting of a bypass capacitor for example, could short the power bus on a controller. However, the primary and secondary memory controllers remain powered through the connection to the auxiliary power output for the other controller power source. FIG. 3 shows that loss of power source 46 will cause all the shaded components to cease operation (the disk drives themselves are supplied by yet other power sources) while primary controller 12A and the secondary controller 12B, along with memory 20, remain active. This allows host write data recovery by operation of controller 12 to transfer that data from memory 20 over the serial dump link 22A to the other controller and its memory. Power is maintained to secondary controller 12B, at this time, to ensure that it remains in a known, but dormant, state which typically is a high impedance state. This prevents it from disrupting operation of memory 20 and controller 12A.

Conversely, loss of power supply 50 has no effect on controller 60 because power supply 46 continues to energize all components of that controller. The disappearance of power from auxiliary source 51 has no effect because power is still present on connection 61. Under this set of circumstances, controller 60 takes over and receives the data from the memory of controller 70 substantially as described above. The system thus continues to function, although the host is notified that corrective action is eventually needed to restore complete system operation.

If either controller 60 or 70 encounters unrecoverable errors in data read and write operations, the failing controller shuts itself down, and turns over its operation to the other, redundant controller. It is able to do this if the failure is attributable to loss of a primary power source because of the adequacy of auxiliary power from the redundant power source in accordance with this invention as described above. Thus, the host continues to function with an operable disk storage array while the failure is noted for later curative action of one kind or another.

Note that during normal operations, the system is responsive to clock signals from crystal oscillator 55. Further, clock pulse source 55 is utilized in transferring data from memory 20 under direction of controller 12A if power from supply 46 is lost. Controllers 12B and 13B normally work with a phase lock loop crystal oscillator 58 which is functionally coordinated with the output of clock pulse source 55.

However, oscillator 58 is arranged to remain within an acceptable tolerance range of clock pulse generation in the event master crystal oscillator 55 ceases functioning for some reason. This permits the system to recover and transfer control to the other redundant disk array controller, despite loss of the source of master clock pulses. Under those circumstances, and as is apparent in FIG. 4, transfer of control along with received write data is effected via memory controller 13, shadow memory 21, and serial dump link 22B.

While the exemplary preferred embodiments of the present invention are described herein with particularity, those having normal skill in the art will recognize various changes, modifications, additions and applications other than those specifically mentioned herein without departing from the spirit of this invention.

What is claimed is:

1. A method that utilizes at least a first and a second power source to enhance the reliability of operation of a controller, said controller having a plurality of power-consuming elements that operate to receive data-exchange-controlling-commands from a remote-computer, said controller having a fast-memory that operates to buffer data that accompanies said data-exchange-controlling-commands, said fast-memory operating to buffer said data between the remote-computer and at least one satellite data storage unit that is connected to an output terminal of said controller, said controller including a power-consuming-element-subset that consists of less than all of said plurality of power-consuming-elements, said power-consuming-element-subset operating to retrieve data from said fast-memory and to then transfer said retrieved data to said output terminal, said method comprising the steps of:

providing a first and a second power source;

providing energizing power to all of said plurality of power-consuming elements from said first power source;

concurrently providing energizing power to said element-subset from said second power source;

sensing loss of energizing power from said first power source;

responding to said loss of energizing power; and thereafter utilizing said second power supply to cause said element-subset to transfer data contained in said fast-memory to said output terminal.

2. The method of claim 1 wherein said element-subset includes a DRAM, a memory-controller attached to said DRAM, and a diode coupler connecting said first and second power sources to said DRAM and to said memory-controller.

3. The method of claim 2 wherein said element-subset includes a frequency-stable oscillator for generating a stream of clock pulses, means connecting said clock pulses to said memory-controller, and wherein said diode coupler also connects said first and second power sources to said oscillator.

4. The method of claim 3 wherein:

said first power source includes a main-power-output-bus that provides adequate power for energizing all of said plurality of power-consuming elements;

said second power source includes an auxiliary-power-output that provides adequate power for energizing said element-subset;

said diode coupler implements a logical-or-function; and said diode coupler connects said main-power-output-bus of said first power supply and said second power source auxiliary-power-output to said element-subset by way of said logical-or-function.

5. A system responding to requests from a host-computer, and operable to transfer data between said host-computer and an array of data-storing-media, said system comprising:

first and second controllers;

each of said first and second controllers having a host-interface-device, a first group of power-consuming elements that includes at least a host-interface-device, and a data-storing-media-interface-device;

each of said first and second controllers having a second group of power-consuming elements that includes at least a buffer-memory and a memory-controller; first and second power supplies;

each of said first and second power supplies having a main-output-connection providing adequate power for energizing said first and said second group of power-consuming elements of at least one of said controllers;

each of said first and second power supplies having an auxiliary-output-connection providing adequate power for energizing said second group of power-consuming elements of at least one of said controllers;

first circuit-means coupling said main-output-connection of said first power supply to said first and second group of power-consuming elements of said first controller;

second circuit-means coupling said main-output-connection of said second power supply to said first and second group of power-consuming elements of said second controller;

third circuit-means coupling said auxiliary-output-connection of said first power supply to said second group of power-consuming elements of said second controller; and fourth circuit-means coupling said auxiliary-output-connection of said second power supply to said second group of power-consuming elements of said first controller.

6. A system in accordance with claim 5 further including:

data-communicating means operable to transfer data between said memory-controllers of said first and second controllers;

first power failure responsive means responsive to failure of said first power supply for causing said memory-controller of said first controller to transfer data from said buffer-memory of said first controller to said buffer-memory of said second controller; and second power failure responsive means responsive to failure of said second power supply for causing said memory-controller of said second controller to transfer data from said buffer-memory of said second controller to said buffer-memory of said first controller.

7. A system in accordance with claim 6 wherein said second group of power-consuming elements of said first and second controllers each include:

an oscillator producing a stream of actuating clock pulses;

and circuit means connecting said clock pulses to a memory-controller associated therewith.

8. A system in accordance with claim 7 wherein:

said first power-failure responsive means is operable when power supply failure of said first power supply occurs after said host-computer has transferred data to said first controller for transfer into a storage media; and said second power-failure responsive means is operable when power supply failure of said second power supply occurs after said host-computer has transferred data to said second controller for transfer into a storage media.

9. A system in accordance with claim 8 wherein:

said first and second power-failure responsive means include means for notifying said host-computer that a power supply failure has occurred.

10. A method that utilizes at least first and second power sources for enhancing the reliability of operation of a controller, said controller having a plurality of power-consuming elements that are arranged to receive controlling-commands from a remote-computer, said controller utilizing a fast-memory to buffer data that accompanies said controlling-commands, said fast-memory operating to buffer said data between the remote-computer and at least one satellite data storage unit, said controller including an element-subset that is less than all of said plurality of power-consuming elements, said element-subset operating to retrieve data from said fast-memory and to transfer said retrieved data to a controller output terminal, said method comprising the steps of:

providing energizing power to all of said plurality of elements from said first power source;

concurrently providing energizing power to said element-subset from said second power source;

sensing loss of energizing power from said first power source; and in response to sensing said loss of energizing power from said first power source, causing said element-subset to transfer data contained in said fast-memory to said output terminal.

11. In a data processing installation having a host-computer and a first and a second controller that receive data from said host-computer, wherein said first and second controllers operate to effect writing said received-data to an array of data-storing-media, a system that enhances the reliability of said writing of said received-data, said system comprising:

fast-memory means in each of said first and second controllers enabling fast-storage of said received-data, whereupon an acknowledge-signal is thereafter sent to said host-computer, and whereupon said fast-stored received-data within said fast-memory means is thereafter written to said array of data-storage-media;

first and second power supplies;

each of said first and second power supplies having a main-power-output providing power for enabling energization of one of said first and second controllers;

each of said first and second power supplies having an auxiliary-power-output providing power for enabling energization of one of said fast-memory means;

first circuit-means coupling said main-power-output of said first power supply to energize said first controller;

second circuit-means coupling said main-power-output-said second power supply to energize said second controller;

third circuit-means coupling said auxiliary-power-output of said first power supply to said fast-memory means of said second controller; and fourth circuit-means coupling said auxiliary-power-output of said second power supply to said fast-memory means of said first controller.

12. The system of claim 11 further including:

data-communicating means operable to transfer received-data between said fast-memory means of said first and second controllers;

first power-failure responsive means responsive to failure of said first power supply for causing said fast-memory means of said first controller to transfer data stored therein to said fast-memory means of said second controller; and second power-failure responsive means responsive to failure of said second power supply for causing said fast-memory means of said second controller to transfer data stored therein to the said fast-memory means of said first controller.

13. The system of claim 12 wherein:

said first power-failure responsive means is operable when failure of said first power supply occurs at a time after said acknowledge-signal been sent to said host-computer, but before said fast-stored received-data has been written to said array of data-storage-media; and said second power-failure responsive means is operable when failure of said first power supply occurs at a time after said acknowledge-signal been sent to said host-computer, but before said fast-stored received-data has been written to said array of data-storage-media.

14. The system of claim 13 wherein:

said first and second power-failure responsive means both include means for notifying said host-computer that power supply failure has occurred.

* * * * *